United States Patent [19]
Ohta

[11] Patent Number: 4,891,583
[45] Date of Patent: Jan. 2, 1990

[54] INSPECTION MECHANISM FOR CHIP TYPE CIRCUIT ELEMENT

[75] Inventor: Masanori Ohta, Tokyo, Japan

[73] Assignee: TDK Corporation, Tokyo, Japan

[21] Appl. No.: 294,973

[22] Filed: Dec. 30, 1988

Related U.S. Application Data

[63] Continuation of Ser. No. 936,871, Dec. 2, 1986.

[30] Foreign Application Priority Data

Dec. 23, 1985 [JP] Japan ................... 60-197978

[51] Int. Cl.$^4$ .................. G01R 1/06; G01R 31/02
[52] U.S. Cl. ..................... 324/158 P; 324/72.5; 324/158 F
[58] Field of Search ............. 324/158 P, 158 F, 72.5, 324/73 P C

[56] References Cited

U.S. PATENT DOCUMENTS 4,152,644  5/1979  Lockhart, Jr. ................. 324/158 F
4,686,468  8/1987  Lee et al. ...................... 324/158 F Primary Examiner—Ernest F. Karlsen
Attorney, Agent, or Firm—Kanesaka and Takeuchi

[57] ABSTRACT

An inspection mechanism for a chip type circuit element which is capable of readily and effectively inspecting various kinds of chip type circuit elements different in number of terminals thereof from each other with a simple structure. The inspection mechanism includes a plurality of checking bars arranged in a row on each of both sides of a position at which a chip type circuit element is to be extracted from a chip tape. The checking bars on each side are electrically switchable in a manner to be alternatively electrically independent from or integral with one another.

10 Claims, 2 Drawing Sheets

INSPECTION MECHANISM FOR CHIP TYPE CIRCUIT ELEMENT

This application is a continuation of application Ser. No. 936,871, filed Dec. 2, 1986.

BACKGROUND OF THE INVENTION

1. Field of the Invention

This invention relates to an inspection mechanism for a chip type circuit element, and more particularly to such an inspection mechanism which is adapted to inspect a chip type circuit element to be mounted on a printed circuit board or check characteristics of the circuit element to prevent any defective chip type circuit element from being mounted on the printed circuit board.

2. Description of the Prior Art

Such a conventional inspection mechanism for a chip type circuit element is constructed in such a manner that checking bars corresponding in number to terminals of a chip type circuit element to be inspected are arranged opposite to one another in order at a position at which the chip type circuit element is to be picked out or extracted from a chip tape. Then, the so-arranged checking bars are actuated to cause tip ends thereof to be abutted against the corresponding terminals of the circuit element and electricity is then flowed through the checking bars to detect propriety of the circuit element depending upon the flowing of electricity through the circuit element.

Unfortunately, in the conventional inspection mechanism described above, the number of such checking bars which must be arranged is varied depending upon the number of terminals of a chip type circuit element to be inspected. More particularly, when a chip type circuit element having two terminals such as a resistor, a capacitor, a coil or the like is to be inspected, the inspection mechanism must be provided with two such checking bars; whereas the inspection of a chip type circuit element having three terminals such as a transistor, a diode or the like requires that the inspection mechanism is provided with three such checking bars. This causes the number of such checking bars which are to be incorpo4rated in the inspection mechanism to be varied depending upon the number of terminals of a chip type circuit element to be inspected, resulting in the inspection mechanism being highly complicated in structure and large-sized.

Also, another inspection procedure has been proposed which is adapted to carry out the inspection of an overall printed circuit board during a final step subsequent to soldering to detect any defective circuit element mounted on the printed circuit board and remove it therefrom, and then manually substitute a non-defective circuit element for the defective one. However, this has a disadvantage of being troublesome sufficiently to deteriorate the productivity.

Accordingly, it would be highly desirable to develop an inspection mechanism for a chip type circuit element which is capable of readily and reliably accomplishing the inspection of such a circuit element with a simple structure.

SUMMARY OF THE INVENTION

Generally speaking, in accordance with the present invention, an inspection mechanism for a chip type circuit element is provided. The inspection mechanism of the present invention includes a plurality of checking bars arranged in a row on each of both sides at a position at which a chip type circuit element is to be extracted. The checking bars on each side are electrically switchable in a manner to be alternatively electrically independent from or integral with one another.

Such construction of the inspection mechanism of the present invention can be commonly used for the inspection of various kinds of chip type circuit elements having terminals different in number from one another, because a plurality of the checking bars on each side are electrically connected to in a manner to be alternatively electrically independent from or integral with each other.

Accordingly, it is an object of the present invention to provide in inspection mechanism for a chip type circuit element which is capable of carrying out the inspection of various kinds of chip type circuit elements having terminals different in number from each other without varying checking bars.

It is another object of the present invention to provide an inspection mechanism for a chip type circuit element which is capable of readily and effectively carrying out the inspection of various kinds of chip type circuit elements having terminals different in number from one another.

It is a further object of the present invention to provide an inspection mechanism for a chip type circuit element which is capable of carrying out the inspection of various chip type circuit elements different in number of terminals thereof from one another with high reliability.

It is still another object of the present invention to provide an inspection mechanism for a chip type circuit element which is capable of accomplishing the above-noted objects with a highly simple structure.

Still other objects and advantages of the invention will in part be obvious and will in part be apparent from the specification.

The invention accordingly comprises the features of construction, combination of elements, and arrangement of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings in which like reference numerals designate like parts throughout; wherein.

DETAILED DESCRIPTION OF THE PREFERRED EMBODIMENT

Now, an inspection mechanism for a chip type circuit element according to the present invention will be described hereinafter with reference to the accompanying drawings.

Figure 1:
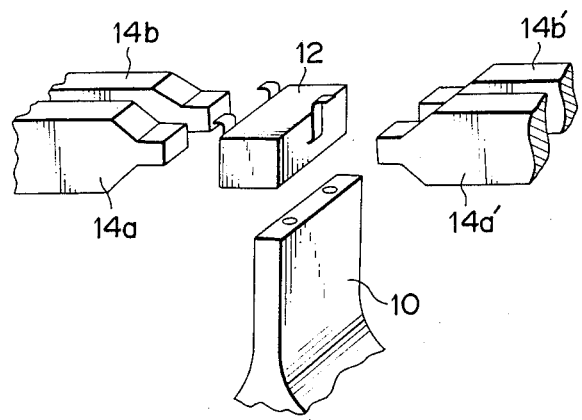
FIG. 1 is a schematic perspective view showing an embodiment of an inspection mechanism for a chiop type circuit element according to the present invention.

FIG. 1 shows an embodiment of an inspection mechanism for a chip type circuit element according to the present invention, wherein an electric current is applied to a chip type circuit element to inspect characteristics of the circuit element based on flow of electicity passing through the circuit element by means of a checking mechanism. An inspection mechanism of the illustrated embodiment includes a suction pin 10 which is rotatably arranged and adapted to pick out or extract a chip type circuit element 12 from a chip tape (not shown) which has a plurality of chip type circuit elements held in series or in a row thereon and then be rotated. In the illustrated embodiment, the suction pin 10 is adapted to vertically act on the circuit element 12.

Figure 2:
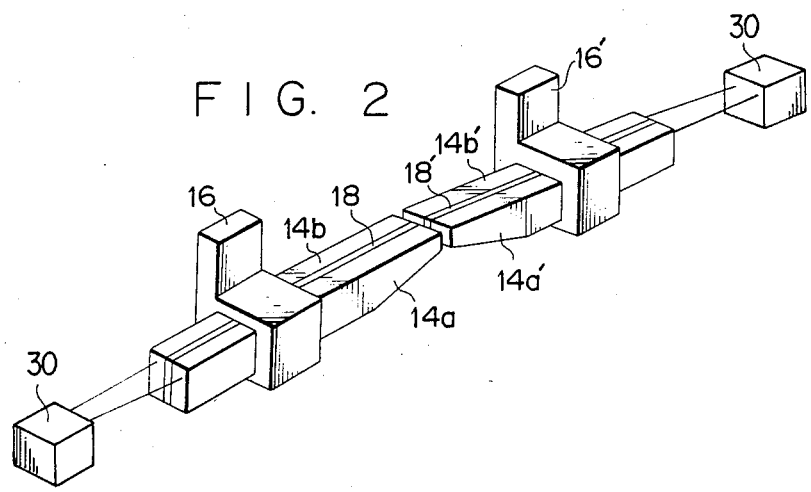
FIG. 2 is a perspective view showing checking bars incorporated in the inspection mechanism shown in FIG. 1.
Figure 3:
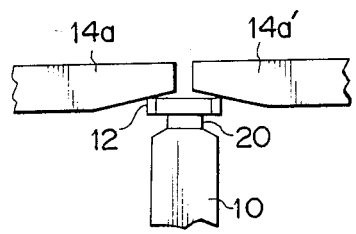
FIG. 3 is a side elevation view showing a suction pin provided in the inspection mechanism shown in FIG. 1.

The inspection mechanism of the illustrated embodiment also includes a plurality of checking bars 14a and 14b or 14a' and 14b' which are arranged in a row and opposite to one another on each of both sides of the position at which the circuit element 12 is to be extracted. In the illustrated embodiment, two such checking bars 14a and 14b or 14a' and 14b' are arranged in a row and at the same level on each side. Also, the checking bars 14a and 14b on one side are opposite to those 14a' and 14b' on the other side. Each of the checking bars 14a, 14b, 14a' and 14b' may comprise a bar body section formed of brass and a tip end section formed of phosphor bronze containing titanium so that it may exhibit satisfactory conductivity. A tip end section of each checking bar is chamfered at the lower portion, as shown in FIGS. 2 and 3. The adjacent checking bars 14a and 14b or 14a' and 14b' on each side, as shown in FIG. 2, are securely held together by means of a holder 16 or 16' with an insulating plate 18 or 18' being interposed therebetween, so that the so-held checking bars 14a and 14b or 14a' and 14b' may be electrically insulated from each other and vertically moved together. Further, the inspection mechanism is so constructed that the checking bars 14a and 14b or 14a' and 14b' on each side are connected to one another in a manner to be alternatively electrically integral with or independent from one another. For this purpose, in the illustrated embodiment, the checking bars 14a, 14b, 14a' or 14b' are connected to a checking mechanism (not shown) which has suitable switching devices 30 such as a mercurcy relay means incorporated therein which is adapted to cause the checking bars on each side to be electrically operated in a manner to be alternatively electrically integral with or independent from each other. Any suitable means which has been conventionally known is used for such a switching device.

In the illustrated embodiment, the suction pin 10, as shown in FIG. 3, has a pad 20 mounted on a tip end thereof of which may be formed of a shock-absorbing material such as, for example, urethane rubber or the like, so that it may absorb force applied to the circuit element 12 due to the downward movement of the checking bars 14a, 14b, 14a' and 14b'.

Now, the manner of operation of the inspection mechanism of the illustrated embodiment constructed as described above will be described hereinafter.

The inspection mechanism of the illustrated embodiment may be incorporated in an automatic mounting apparatus controlled according to a program of a computer to automatically carry out desired operation of mounting a chip type circuit element on a printed circuit board depending upon a type of the circuit element.

The operation of the inspection mechanism is determined depending upon a command generated from the computer depending upon the number of terminals of a chip type circuit element conveyed to the position above the suction pin 10 and, in response to the so-generated command, each of the switching devices 30 is controlled to cause the checking bars on each side to electrically act on the circuit element in a manner to be electrically independent from or integral with each other.

Figure 4:
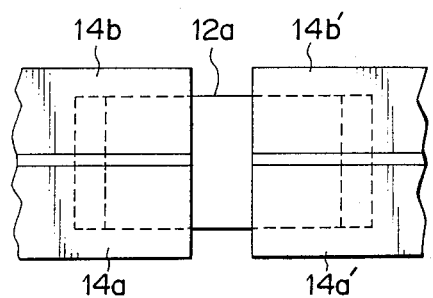
FIGS. 4 to 6 are partial plan views showing operation of switching between checking bars depending upon a circuit element to be inspected.
Figure 5:
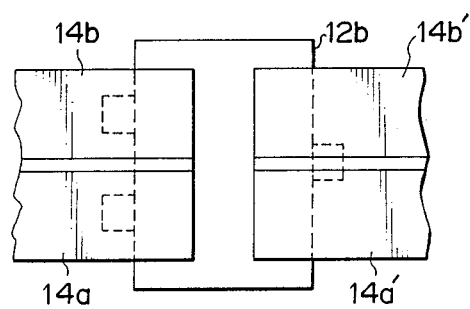
Figure 6:
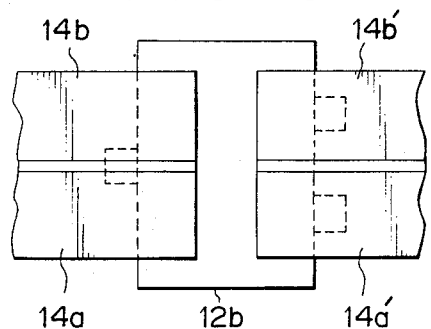

More particularly, when a chip type capacitor 12a having one terminal arranged on each of both sides thereof as shown in FIG. 4 is to be extracted by means of the suction pin 10, the checking bars 14a, 14b and 14a', 14b' on both sides are switched to be electrically integral with each other and then electrically contacted to the terminals of the capacitor 12a for the inspection of the capacitor 12a, respectively. Further, when a chip type transistor 12b is to be extracted which has one terminal arranged on one side and two terminals arranged on the other side as shown in FIG. 5 or 6, the checking bars 14a, 14b and 14a', 14b' on both sides are switched to be electrically operated in a manner to be different from each other. For example, when two terminals are on a left side of the transistor 12b and one terminal is on its right side as shown in FIG. 5, the checking bars 14a, 14b and 14a', 14b' on both sides are switched respectively to be electrically independent from an integral with each other and then contacted with the terminals for the inspection of the transistor 12b. Whereas, when the transistor 12b has one terminal and two terminals arranged on the left and right sides, respectively, the checking bars 14a, 14b and 14a', 14b' on both sides are switched in a manner opposite to that described above.

When the inspection which is carried out in such a manner as described above indicates that a chip type circuit element to be mounted on a printed circuit board has any defect, the computer generates a command to cause the suction pin 10 to exclude the defective circuit element from a circuit element delivering line and a substitute non-detective circuit element to be supplied to the suction pin. This results in troublesome operation which the conventional inspection mechanism carried out for substituting the detective circuit element after it is mounted on the printed circuit being eliminated.

As can be seen from the foregoing, the inspection mechanism of the present invention can readily inspect various kind of chip type circuit elements different in number of terminals thereof from one another with a simple structure. Also, the present invention is adapted to carry out the inspection immediately before the mounting of a chip type circuit element on a printed circuit board, so that only a non-defective circuit element may be permitted to be mounted on the board, resulting in any repairing operation which was conventionally required in view of the characteristics of the circuit element being eliminated.

It will thus be seen that the objects set forth above, among those mode apparent from the preceding description, are efficiently attained and, since certain changes may be made in the above construction without departing from the spirit and scope of theinvention, it is intended that all matters contained in the above description or shown in the accompanying drawings shall be interpreted as illustrative and not in a limiting sense.

It is also to be understood that the following claims are intended to cover all the generic and specific features of the invention herein claimed and all statements of the scope of the invention which, as a matter of language, might be said to fall therebetween.

What is claimed is:

1. An inspection mechanism for a chip type circuit element having at least two sides equipped with one to two terminals on each side, adapted to apply an electric current to a chip type circuit element to inspect characteristics of the circuit element based on flow of electricity passing through the circuit element by means of a checking mechanism; comprising:
    at least two sets of checking bars for applying an electric current to the circuit element and situated on at least two side portions where the circuit element to be inspected is placed, each set having two checking bars situated close to each other without causing electrical connection therebetween, each checking bar having a tip end adapted to be contacted to one of terminals of the circuit element;
    a suction pin for supporting the circuit element at a position to be inspected, said suction pin having a pad mounted on its top and formed of a shock-absorbing material, so that said suction pin absorbs through said pad force applied to the circuit element when said tip end of each checking bar is contacted to the terminal of the circuit element supported by said suction pin; and
    at least two switch devices connected to the respective sets of the checking bars for electrically connecting and disconnecting the checking bars in each set;
    wherein in case the circuit element has one terminal on one side, two checking bars on that side are electrically integrated with each other, thereby applying an electric current to the terminal through the two checking bars electrically integrated together, and in case the circuit element has two terminals on one side, two checking bars on that side are electrically isolated from each other, thereby applying an electric current to the two terminals through the electrically separated two checking bars, respectively.

2. An inspection mechanism as defined in claim 1, wherein a plurality of said checking bars on each side are arranged at the same level.

3. An inspection mechanism as defined in claim 1, wherein each adjacent two checking bars arranged on each side are electrically insulated from each other through an insulating means interposed therebetween.

4. An inspection mechanism as defined in claim 1, wherein said checking bars on both sides are arranged at substantially the same level.

5. An inspection mechanism as defined in claim 3, further comprising a holder for holding the checking bars and insulating means together.

6. An inspection mechanism for a chip type circuit element having at least two sides equipped with one to two terminals on each side, adapted to apply an electric current to a chip type circuit element to inspect characteristics of the circuit element based on flow of electricity passing through the circuit element by means of a checking mechanism, comprising:
    at least two sets of checking bars for applying an electric current to the circuit element and situated on at least two side portions where the circuit element to be inspected is placed, each set having two checking bars situated close to each other without causing electrical connection therebetween, each checking bar having a tip end adapted to be contacted to one of the terminals of the circuit element, said tip end being chamfered at a portion to be contacted to said terminal of said circuit element;
    a suction pin for supporting the circuit element at a position to be inspected, said suction pin having a pad mounted on its top and formed of a shock-absorbing material, so that said suction pin absorbs through said pad force applied to the circuit element when said tip end of each checking bar is contacted to the terminal of the circuit element supported by said suction pin;
    at least two switch devices connected to the respective sets of the checking bars for electrically connecting and disconnecting the checking bars in each set;
    wherein in case the circuit element has one terminal on one side, two checking bars on that side are electrically integrated with each other, thereby applying an electric current to the terminal through the two checking bars electrically integrated together, and in case the circuit element has two terminals on one side, two checking bars on that side are electrically isolated from each other, thereby applying an electric current to the two terminals through the electrically separated two checking bars, respectively.

7. An inspection mechanism as defined in claim 6, wherein a plurality of said checking bars on each side are arranged at the same level.

8. An inspection mechanism as defined in claim 6, further comprising insulating means interposed between the adjacent two checking bars arranged on each side so that the two checking bars are electrically insulated from each other.

9. An inspection mechanism as defined in claim 6, wherein said checking bars on both sides are arranged at substantially the same level.

10. An inspection mechanism as defined in claim 8, further comprising a holder for holding the checking bars and insulating means together.

* * * * *